United States Patent [19]
Koden et al.

[11] Patent Number: 4,918,494
[45] Date of Patent: Apr. 17, 1990

[54] THIN FILM TRANSISTOR

[75] Inventors: Mitsuhiro Koden, Nara; Hirohisa Tanaka, Gose; Kohzo Yano, Yamatokoriyama, all of Japan

[73] Assignee: Sharp Kabushiki Kaisha, Japan

[21] Appl. No.: 304,278

[22] Filed: Jan. 31, 1989

Related U.S. Application Data

[63] Continuation of Ser. No. 235,728, Aug. 19, 1988, Pat. No. 4,843,438, which is a continuation of Ser. No. 57,743, Jun. 3, 1987, abandoned, which is a continuation of Ser. No. 797,660, Nov. 13, 1985, abandoned.

[30] Foreign Application Priority Data

Nov. 13, 1984 [JP] Japan ................................. 59-239653
Nov. 13, 1984 [JP] Japan ................................. 59-239654

[51] Int. Cl.⁴ ..................... H01L 45/00; H01L 27/12; H01L 29/78; H01L 23/48
[52] U.S. Cl. .......................................... 357/4; 357/2; 357/237; 357/68
[58] Field of Search ....................... 357/23.7, 2, 4, 45, 357/68; 350/334

[56] References Cited

U.S. PATENT DOCUMENTS

| 4,112,333 | 9/1978 | Asars et al. | 357/23.7 |
| 4,404,578 | 9/1983 | Takafuji et al. | 357/23.7 |
| 4,597,001 | 6/1986 | Bortscheller et al. | 357/23.7 |
| 4,704,002 | 11/1987 | Kikuchi et al. | 357/23.7 |
| 4,778,560 | 10/1988 | Takeda et al. | 357/237 |
| 4,804,953 | 2/1989 | Castleberry | 357/23.7 |

Primary Examiner—J. Carroll

[57] ABSTRACT

A thin film transistor which includes an insulative substrate, and a gate electrode, a gate insulating film, a semi-conductor film, a source electrode, and a drain electrode, which are all laminated in that order onto the insulating substrate in the form of an array. The gate electrode is made of tantalum, and the gate insulating film is formed into a double-layered construction of an anodized tantalum film and a silicon nitride film, while the semi-conductor film is provided at each intersection between the gate electrode and the source electrode.

7 Claims, 3 Drawing Sheets

THIN FILM TRANSISTOR

This application is a continuation of copending application Ser. No. 07/235,728, filed on Aug. 19, 1988, U.S. Pat. No. 4,843,438, that is a continuation of application Ser. No. 057,743 filed June 3, 1987, abandoned, that is a continuation of application Ser. No. 797,660 filed Nov. 13, 1985, abandoned.

BACKGROUND OF THE INVENTION

The present invention generally relates to a transistor and more particularly, to a thin film transistor (normally abbreviated as TFT) having a construction which is intended to achieve an improvement on yield in the manufacture thereof.

Recently, in the field of a liquid crystal active matrix display, vigorous studies have been made into an active matrix substrate in which thin film transistors are created in the form of a matrix on an insulative substrate. Available semi-conductor materials for this purpose include polySi, a-Si, Te, CdSe, etc.

In FIG. 5, and FIG. 4 showing a cross section taken along the line IV—IV of FIG. 5, one example of the construction of a conventional thin film transistor TFT employing a-Si is illustrated, in which a gate wiring 3 for connecting gate electrodes 2 if formed on a glass substrate 1 by a metallic material such as Ta, Mo, Ti Al or the like in a film having a thickness of 200 to 3000 Å. The gate wiring 3 is provided with a branched portion 3a and the thin film transistor TFT is formed on said branched portion 3a as a center. Over the gate electrode 2, a gate insulating film 4 (not shown in FIG. 5) of silicon nitride (referred to as SiNx hereinafter) in the thickness of 1000 to 2000 Å is formed by a plasma CVD (chemical vapor deposition) process. Further formed on the gate insulating film 4 is an a-Si layer 5 having a thickness of 1000 to 3000 Å by the plasma CVD process. A source wiring 7 for connecting source electrodes 6 is formed to intersect at right angles with the gate wiring 3. The source electrode 6 and a drain electrode 8 are both formed by a metallic material such as Ta, Mo, Ti, Al or the like in the thickness of 2000 to 10000 Å. In connection with the above, it is preferable to dispose another a-Si film 9 having a thickness of 500 to 2000 Å and doped with phosphorus, between the source electrode 6 and drain electrode 8 and the a-Si film 5 so as to achieve ohmic contact therebetween. In the manner as described above, the thin film transistors, TFT, are formed in the shape of an array at respective intersections between the gate wiring 3 and the source wiring 7. Although not particularly shown, picture element electrodes corresponding to the respective thin film transistors TFT are formed to contact the drain electrodes 8.

In an active matrix substrate employing the thin film transistors, the respective intersections are driven by a linear sequential system. More specifically, scanning signals are applied from one gate wiring to be scanned, while data signals are inputted from each source wiring. There are a large number of intersections between the gate wirings and source wirings, for example, at 62,500 spots in a 250×250 matrix. If leakage should take place between the gate and source, even at one of these numerous intersections, a line fault in the form of a cross is inevitably produced at the equivalent gate wiring and source wiring, thus making the display unsuitable for actual application, with the yield of the active matrix substrate being reduced to zero. Accordingly, as the number of the gate wirings and source wirings increases, positive insulation between the gate and source is even more necessary.

As in the thin film transistor shown in FIGS. 4 and 5, in the case where the gate insulating film is formed by only one layer of the thin film 4, it is extremely difficult to reduce to zero, the leakage between the gate and source which takes place due to presence of foreign matter, pin holes, etc. As countermeasures against the above disadvantage, there has been proposed a practice in which a double-layered film of an anodized film of gate metal and SiNx film by the plasma CVD is employed, A film of tantalum pentoxide obtained by anodizing tantalum is very stable both chemically and physically, and characterized in that is has a dielectric constant larger than that of a silicon group material. Moreover, since the anodized film is produced by a reaction in a solution, there is such an advantage that, even in the case where pin holes, cracks, foreign matter, etc. are present in the gate metal, such portions are anodized to be covered by an insulating material.

FIG. 6 shows one example of a thin film transistor TFT in which tantalum is employed for the gate metal, while a double-layered film of tantalum pentoxide formed by anodizing and SiNx film formed by the plasma CVD is adopted as the gate insulating film. The thin film transistor of FIG. 6 includes an insulative substrate 1, and a gate electrode 11 of tantalum, an anodized tantalum film 12, an SiNx film 13 formed by the plasma CVD, a semi-conductor layer 14, a source wiring 15 and a drain electrode 16 which are all sequentially laminated on said insulative substrate 1 in the above order. In the thin film transistor in FIG. 6, although the leakage between the gate and source has been reduced to a large extent as compared with that in the thin film transistor having the construction as shown in FIG. 4, the yield thereof in manufacture is not as yet favorable.

As a result of the investigation into the cause of the above disadvantage through "copper decoration method", it has been discovered that the leakage between the gate and source frequently takes place at portions where edges of the gate and the source intersect each other (i.e., at hatched portions in FIG. 5), and that in a portion where a semi-conductor film is present between a gate electrode and source electrode, the degree of leakage occurrence is by far smaller than that at a portion where no semi-conductor film is present therebetween. The above phenomenon is considered to be attributable to the fact that, as shown in FIG. 7, since the anodized film 12 of the gate electrode 11 by tantalum grows isotropically, edges of the gate electrode 11 have a considerably sharp angle, and the SiNx film 13 laminated thereover becomes very thin at such edge portions, with a consequent reduction in the withstand voltage as a gate insulating film. The phenomenon may also be ascribed to the fact that the nature of the gate insulating film is different between a flat portion and a stepped portion, and the stepped portion is inferior to the flat portion in the aspect of insulation.

SUMMARY OF THE INVENTION

Accordingly, an essential object of the present invention is to provide an improved thin film transistor which has a construction capable of improving yield in the manufacture thereof.

Another important object of the present invention is to provide a thin film transistor of the above described type which is simple in construction and stable in operation and can be readily manufactured on a large scale at low cost.

In accomplishing these and other objects, according to one preferred embodiment of the present invention, there is provided a thin film transistor which comprises an insulative substrate, and a gate electrode, a gate insulating film, a semi-conductive film, a source electrode, and a drain electrode, which are all laminated in said order onto said insulating substrate in the form of an array, and is characterized in that the source electrode is formed on the gate electrode so as not to be superposed on edge portions of said gate electrode, and also in that said gate electrode is made of tantalum, and the gate insulating film is formed onto a double-layered construction of an anodized tantalum film and a silicon nitride film, with said semi-conductor film being provided at each intersection between said gate electrode and said source electrode.

By the arrangement according to the present invention as described above, the intersections between edge portions of the gate wiring and the source wiring are reduced to a minimum, and the withstand voltage at the edge portions is increased by disposed the semi-conductor film at the portions where the edges of the gate electrode and the source electrode intersect each other (i.e., at the above edge portions), while by preventing erosion of the SiNx film at such portions by an etchant for etching the semi-conductor film, generation of leakage between the gate and source is suppressed, thereby improving the yield of thin film transistors.

BRIEF DESCRIPTION OF THE DRAWINGS

These and other objects and features of the present invention will become apparent from the following description taken in conjunction with the preferred embodiment thereof, with reference to the accompanying drawings, in which.

DETAILED DESCRIPTION OF THE PREFERRED EMBODIMENTS

Figure 1:
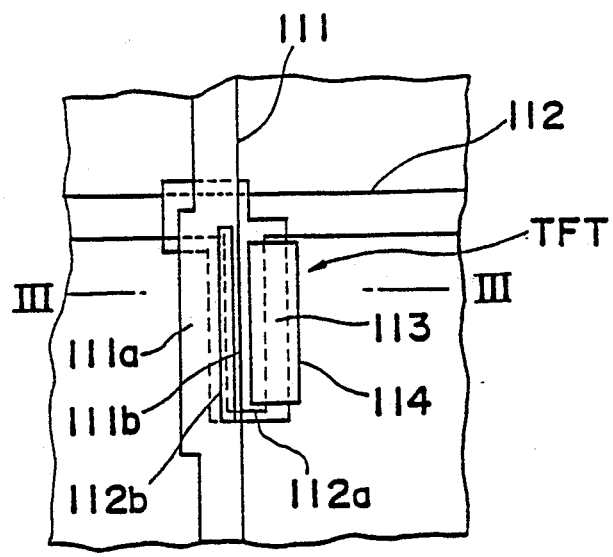
FIG. 1 is a fragmentary top plan view showing a thin film transistor according to one preferred embodiment of the present invention.

Before the description of the present invention proceeds, it is to be noted that like parts are designated by like reference numerals throughout the accompanying drawings.

Figure 2:
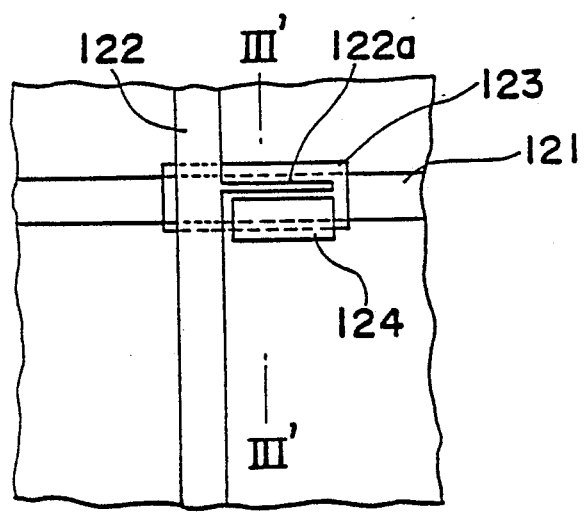
FIG. 2 is a view similar to FIG. 1, which particularly shows another embodiment thereof.

Referring now to the drawings, there are shown in FIGS. 1 and 2 thin film transistors according to preferred embodiments of the present invention.

In the embodiment of FIG. 1, a source wiring 111 is formed into double wiring 111a and 111b at one portion, and the thin film transistor TFT is formed by one wiring 111b of the double wiring and a branched portion 112a provided on a gate wiring 112. More specifically, the double wiring 111a and 111b extend in parallel relation to each other, with one edge portion 112b of the branched portion 112a of the gate wiring 112 being positioned therebetween, without being superposed on said edge portion 112b. Thus, in a thin film transistor, the source electrode is formed on the gate electrode so as not to be superposed on the edge portions of the gate electrode. In the above construction, the intersecting portions (i.e., the dotted line portions in FIG. 1) between the edge portion 112b of the gate wiring 112 and the source wiring 11 are reduced to the minimum. It is to be noted here that the double wiring is employed, since the current capacity is not sufficient by the branched portion 112a alone which constitutes the thin film transistor.

In the embodiment of FIG. 2, the gate wiring 121 is arranged to have no branched portion, while the source wiring 112 is provided with a branched portion 122a extending in a longitudinal direction of the gate wiring 121, and the thin film transistor is formed on said branched portion 122a. In the above construction, the width of the line for the branched portion 122a is made smaller than a width of the line for the gate wiring 121, so as to reduce the intersection portions (i.e., the dotted line portions in FIG. 2) between the edge portions of the gate wiring 121 and the source wiring 122 to the minimum.

Moreover, in each arrangement of FIGS. 1 and 2, the semi-conductor film 113 or 123 is provided at each intersecting portion between the gate wiring and the source wiring, with a drain electrode 114 or 124 being further provided. Accordingly, there is no region where only the gate insulating film is present between the gate and source.

Although there has already been reported a thin film transistor having a construction which adopts only the SiNx film for a gate insulating film, without employment of any anodized film, and provides semi-conductor films at all intersecting portions between the gate wiring and the source wiring [in technical research report (YOKOSHU) No. CPM-83-42 (1983) of Denkitsushin Gakkai of Japan by Ikeda, Takesada, Namida, and Okita], the present inventors have found through experiments that the leakage between the gate and source is not sufficiently reduced unless the double-layered film in which the anodized film and SiNx film are combined for a gate insulating film, is employed as in the present invention. The above fact shows that the anodized film formed by the reaction in the solution is effective for suppression of the leakage between the gate and source produced by foreign matter, pin holes, cracks, etc. on the gate metal.

Figure 4:
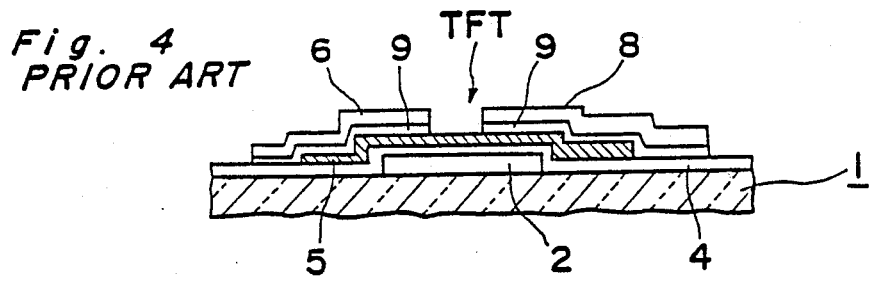
FIG. 4 is a side sectional view of a conventional a-Si layer thin film transistor taken along the line IV—IV in FIG. 5 (already referred to)
Figure 5:
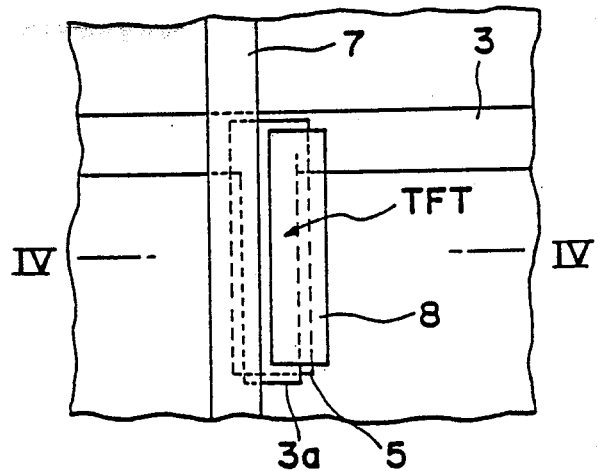
FIG. 5 is a fragmentary top plan view of the thin film transistor of FIG. 4 (already referred to)
Figure 6:
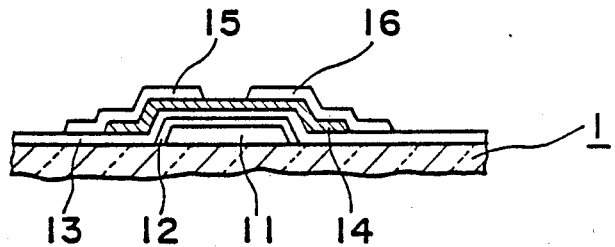
FIG. 6 is a side sectional view of a conventional thin film transistor employing a double-layered film for a gate insulating film (already referred to)
Figure 7:
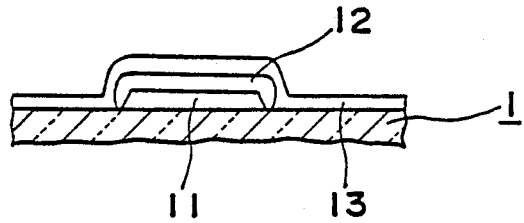
FIG. 7 is a view similar to FIG. 6 for particularly explaining a disadvantage in the thin film transistor of FIG. 6.

In the thin film transistors according to the present invention having the constructions as shown in FIGS. 1 and 2, the intersecting portions (i.e., the dotted line portions) between the edge portions of the gate wiring and the source wiring are reduced to a large extent as compared with those in the conventional thin film transistor in FIGS. 4 and 5, with the semi-conductor film being provided at all intersecting portions between the gate and source, whereby it has become possible to remarkably reduce the leakage between the gate and source.

Specifically, the thin film transistors of the present invention described so far with reference to FIGS. 1 and 2 are manufactured in the manner as shown in FIGS. 3(a) through 3(d).

Figure 3A:
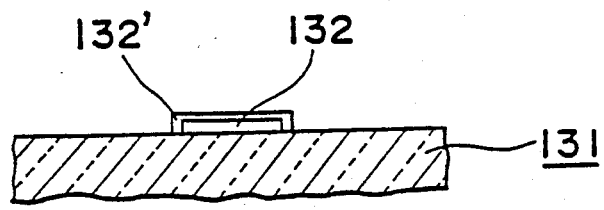
FIGS. 3(a) through 3(d) are schematic cross sectional diagrams taken along the line III—III in FIG. 1 or III'—III' in FIG. 2 for explaining manufacturing processes of the embodiments of the present invention.
Figure 3B:
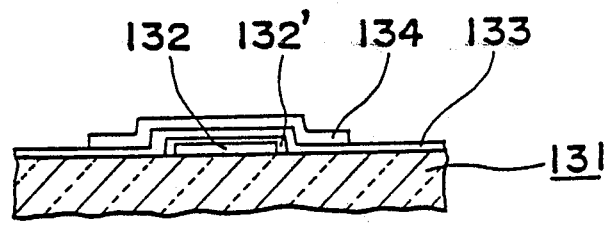

In the first place, a tantalum layer in the thickness of 2000 Å is applied by sputtering onto the entire surface of a glass substrate 131, and formed into a pattern in the form of the gate wiring 112 or 121 by a hot etching process as shown in FIG. 1 or FIG. 2 to provide the gate electrode 132 as illustrated in FIG. 3(a), and then, the tantalum layer is anodized to form the oxidized tantalum layer 132'. Thereafter, as shown in FIG. 3(b), the SiNx film 133 in the thickness of 1500 Å is formed as the insulating film by the plasma CVD, and then, the a-Si layer 134 in the thickness of 1500 Å is applied onto the entire surface as the semi-conductor layer. Subsequently, by the ordinary hot etching process, the a-Si layer 134 is formed into a pattern of an island-like shape as shown at 113 or 123 in FIG. 1 or FIG. 2. Thereafter, the a-Si layer 135 doped with phosphorus is formed in the thickness of 1000 Å by the plasma CVD process, with subsequent application of a Ti layer 136 in the thickness of 1000 Å and an Al layer 137 in the thickness of 2000 Å by a vacuum evaporation process.

Figure 3C:
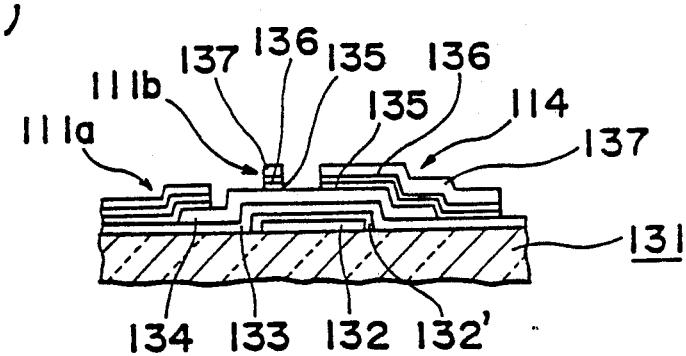
Figure 3D:
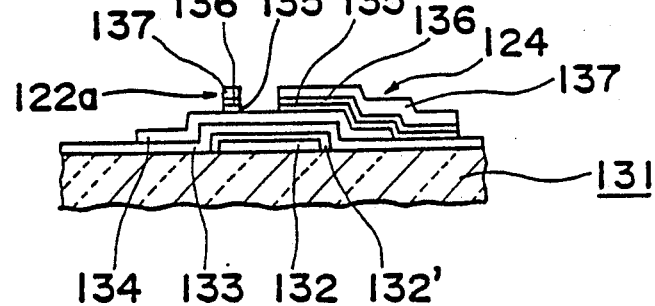

Subsequently, as shown in FIG. 3(c) or FIG. 3(d), by forming into patterns to correspond to the source wiring 111 or 122 and the drain electrode 114 or 124 in FIG. 1 or FIG. 2, the source electrode and drain electrode are formed.

As is clear from the foregoing description, according to the present invention, a thin film transistor with an improved yield may be provided through simple construction, and in an efficient manner on a large scale at low cost.

Although the present invention has been fully described by way of example with reference to the accompanying drawings, it is to be noted here the various changes and modifications will be apparent to those skilled in the art. Therefore, unless such changes and modifications depart from the scope of the present invention, they should be construed as being included therein.

What is claimed is:

1. A thin film transistor, comprising:
an insulative substrate having a relatively planar transistor supporting surface;
a gate electrode bus of a first width disposed on said supporting surface of said substrate and extending along said surface in a first lateral direction and having a transistor forming a portion, thereof, functioning as a transistor gate;
a gate insulating film disposed atop at least said transistor forming portion of said gate electrode bus;
a semiconductor film disposed atop said gate insulating film;
a source electrode bus disposed atop said semiconductor film and extending along a second lateral direction orthogonal to said first lateral direction, said source electrode bus having a branch portion of a second width disposed atop said semiconductor film extending substantially parallel to said first lateral direction, said second width being smaller than said first width; and
a drain electrode, disposed atop said semiconductor film without intersecting said source electrode bus, wherein said branch portion extends over a first portion of said semiconductor film such that the entirety of said branch portion is disposed over said gate electrode bus with no portion of said branch portion extending over an edge of said gate electrode bus.

2. The transistor of claim 1, wherein said gate electrode bus is tantalum and said gate insulating film is a double layered construction of anodized tantalum film and a silicon nitride film.

3. A thin film transistor as claimed in claim 1, wherein said semiconductor film is an amorphous silicon thin film.

4. A thin film transistor, comprising:
an insulative substrate having a relatively planar transistor supporting surface;
a gate electrode bus disposed on said supporting surface of said substrate and extending along said surface in a first lateral direction, said gate electrode bus having an edge and having a transistor forming a portion, thereof, functioning as a transistor gate;
a gate insulating film disposed atop at least said transistor forming portion of said gate electrode bus;
a semiconductor film disposed atop said gate insulating film;
a source electrode bus disposed atop said semiconductor film and extending along a second lateral direction orthogonal to said first lateral direction, but substantially in the plane of said supporting surface;
said source electrode bus having a branch portion extending therefrom and the entirety of said branch portion is disposed over said portion of said transistor gate without extending over a substantial portion of said edge thereof to thereby reduce gate to source leakage; and
a drain electrode disposed atop said semiconductor film, parallel to said branch portion and extending over portion of said transistor gate without intersecting said source electrode bus.

5. The thin film transistor of claim 4, wherein said gate electrode bus is tantalum and said gate insulating film is a double layered construction of anodized tantalum film and a silicon nitride film.

6. The thin film transistor of claim 4, wherein said semiconductor film is an amorphous silicon thin film.

7. The thin film transistor of claim 4, wherein said gate electrode bus is tantalum and said gate insulating film is a double layered construction of anodized tantalum film and a silicon nitride film, and said semiconductor film is an amorphous silicon thin film.

* * * * *